(12) United States Patent
Fu et al.

(10) Patent No.: US 8,390,285 B2
(45) Date of Patent: Mar. 5, 2013

(54) SIDE-BAND SUPPRESSION METHOD AND SIDE-BAND SUPPRESSION DEVICE

(75) Inventors: Cai Xia Fu, Shenzhen (CN); Guo Bin Li, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 409 days.

(21) Appl. No.: 12/842,121

(22) Filed: Jul. 23, 2010

(65) Prior Publication Data

US 2011/0043203 A1 Feb. 24, 2011

(30) Foreign Application Priority Data

Jul. 24, 2009 (CN) .......................... 2009 1 0157758

(51) Int. Cl.
*G01V 3/00* (2006.01)
(52) U.S. Cl. ........................................................ 324/307
(58) Field of Classification Search .......... 324/300–322; 600/410–435
See application file for complete search history.

(56) References Cited

U.S. PATENT DOCUMENTS

| | | | | |
|---|---|---|---|---|
| 4,885,542 A | * | 12/1989 | Yao et al. ....................... | 324/313 |
| 5,451,877 A | * | 9/1995 | Weissenberger .............. | 324/322 |
| 6,037,772 A | * | 3/2000 | Karczmar et al. ............ | 324/309 |
| 6,160,397 A | * | 12/2000 | Washburn et al. ............ | 324/309 |
| 8,258,785 B2 | * | 9/2012 | Hirata et al. .................. | 324/307 |

OTHER PUBLICATIONS

U.S. Appl. No. 12/842,459, filed Jul. 23, 2010.

* cited by examiner

*Primary Examiner* — Dixomara Vargas
(74) *Attorney, Agent, or Firm* — Schiff Hardin LLP

(57) ABSTRACT

In a method and device for side-band suppression, a positive eddy current correction factor and negative eddy current correction factor are determined and scanning N/2 times by a positive gradient takes place, and the positive gradient scanning signal is collected during each scan. Scanning N/2 times by a negative gradient also takes place, and the negative gradient scanning signal is collected during each scan. N is an even number. An eddy current correction of the N/2 positive gradient scanning signals collected according to the positive eddy current correction factor is performed as an eddy current correction of the N/2 negative gradient scanning signals collected according to the negative eddy current correction factor. The side-band suppressed spectrum signal according to the N/2 positive gradient scanning signals that have undergone the eddy current correction is calculated, as is the N/2 negative gradient scanning signals that have undergone the eddy current correction. The method and device according to the present invention can effectively suppress the side band.

16 Claims, 6 Drawing Sheets

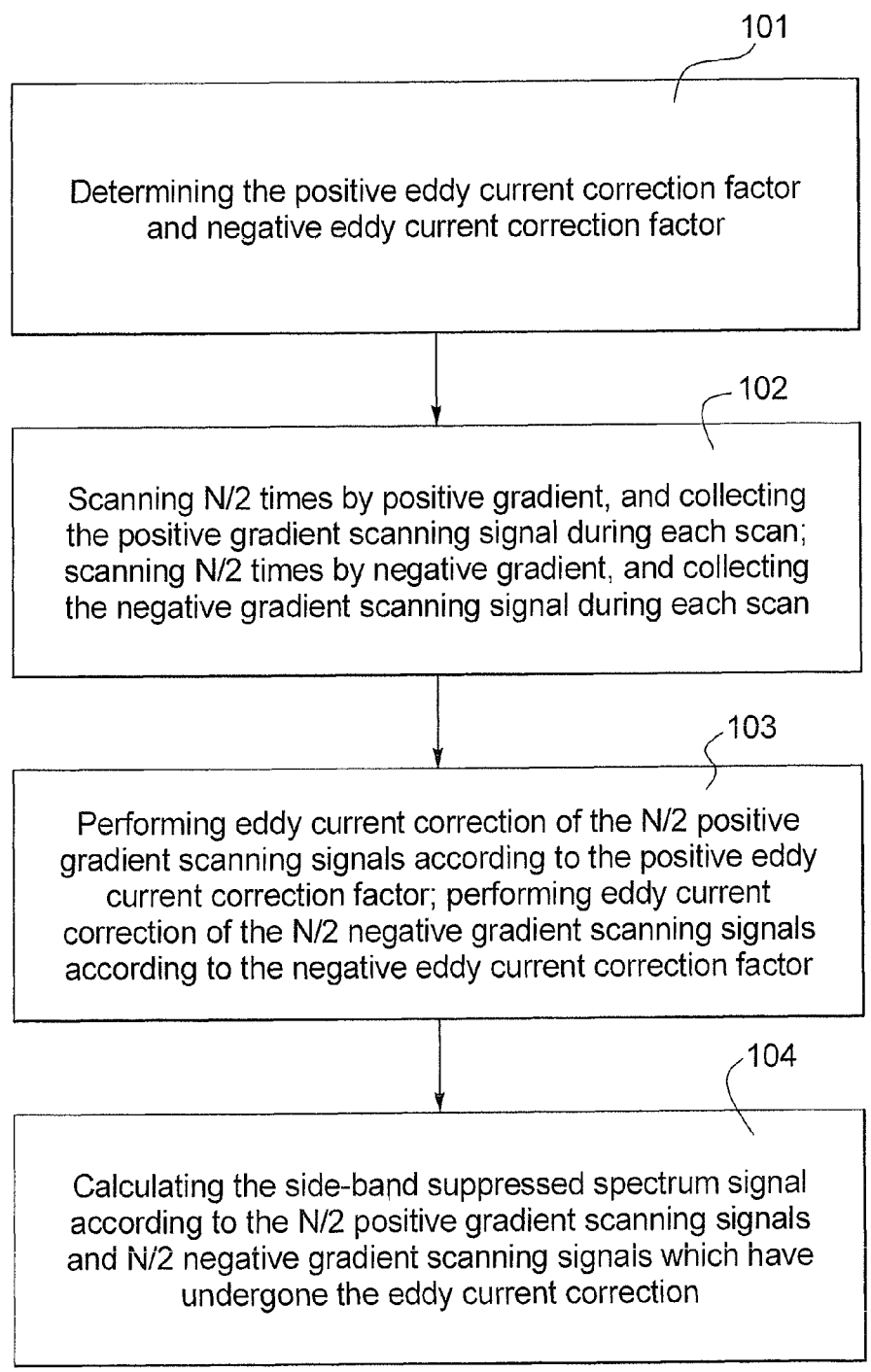

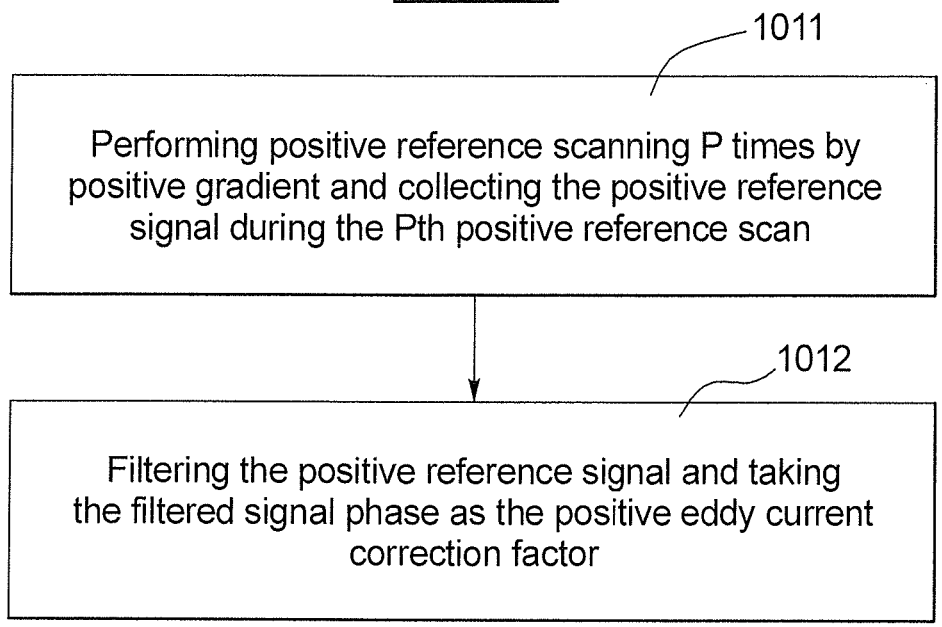
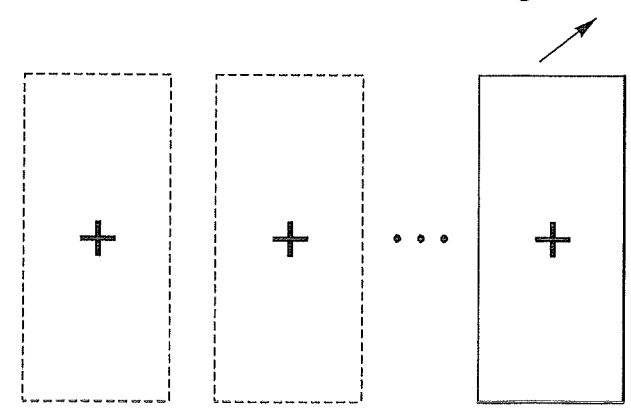

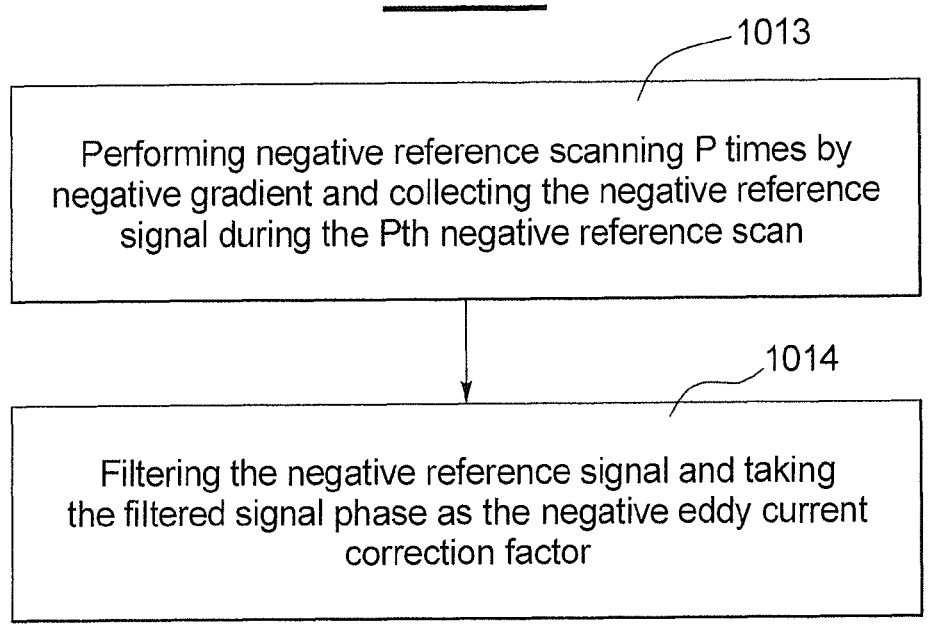
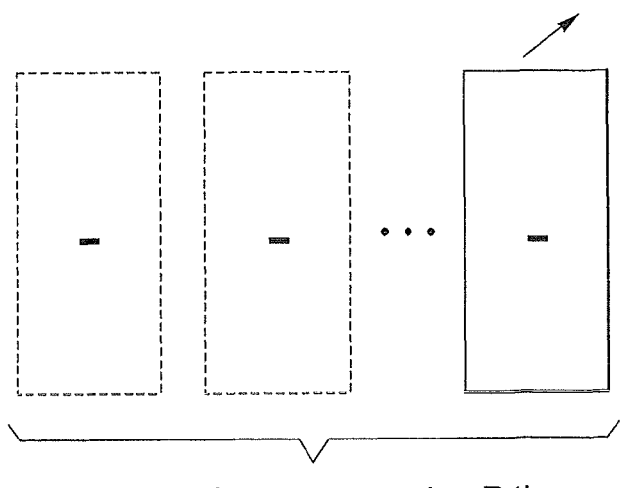

SIDE-BAND SUPPRESSION METHOD AND SIDE-BAND SUPPRESSION DEVICE

BACKGROUND OF THE INVENTION

1. Field of the Invention

The present invention relates to magnetic resonance spectroscopic imaging technology, and more particularly to a side-band suppression method and a side-band suppression device.

2. Description of the Prior Art

As medical imaging develops, a new noninvasive examination method emerges in the magnetic resonance spectroscopic imaging field. In normal tissues, metabolites can be present in normal concentration. When pathological changes occur in the tissue, the concentration of the metabolites will change. Magnetic resonance spectroscopic imaging can obtain the metabolite concentration by observing the spectrum of the metabolites and further analyze the metabolite concentration to achieve the goal of disease diagnosis.

However, if there is imperfection in the design of the gradient system, the gradient switching can lead to mechanical vibration of the magnet, causing the main magnet field (B0 field) to oscillate over time, which leads to frequency modulation of the spectrum signal. In the spectrum, it appears as weak signal peaks, or side bands, in both sides of the normal signal peak. As the side-band intensity is proportional to the intensity of the modulated signal, the side bands will have a high intensity when the modulated signal has a high intensity and the high intensity side bands overlap and mix with the metabolite spectrum signal, causing difficulty in observation of the metabolite spectrum signal.

In order to suppress the side bands, the positive and negative gradient scanning method are commonly used in the prior art. Supposing the number of scans is N, wherein N is an even number, the gradient polarity used for the first N/2 scans is opposite to that used for the subsequent N/2 scans. For example, a positive gradient is used for the first N/2 scans and a negative gradient is used for the subsequent N/2 scans. Then the signals obtained from each scan are added up and the average value of the sum is calculated. The signal obtained by this scanning method is regarded as a signal without side bands. The theoretical foundation of this method is that the phase of the side-band signal is correlated to the polarity of the gradients and that changing the polarity of the gradients can change the phase of the side-band signal by 180 degrees, without affecting the phase of the metabolite signal. Two side-band signals with phase difference of 180 degrees can offset each other by addition. Theoretically the method can eliminate the side bands.

However, in real application, due to the existence of eddy current, the phase difference between the side-band signals in positive and negative gradient scanning is not exactly 180 degrees. Therefore the two side-band signals cannot completely offset each other. What is worse, the eddy current can also cause the initial phase deviation of the positive and negative gradient scanning signals, which leads to reduced signal-to-noise ratio (SNR) of the added up spectrum signal. For these reasons, the method provided by the prior art cannot effectively suppress the side bands.

SUMMARY OF THE INVENTION

In view of this, the present invention is intended to provide a side-band suppression method which can effectively suppress side bands.

Another objective of the present invention is to provide a side-band suppression device which can effectively suppress side bands.

Therefore, the present invention provides a side-band suppression method, including: determining the positive eddy current correction factor and negative eddy current correction factor, scanning N/2 times by a positive gradient and collecting the positive gradient scanning signal during each scan, scanning N/2 times by a negative gradient, and collecting the negative gradient scanning signal during each scan, wherein N is an even number, performing an eddy current correction of the N/2 positive gradient scanning signals collected according to said positive eddy current correction factor, and performing an eddy current correction of the N/2 negative gradient scanning signals collected according to the negative eddy current correction factor.

The method further includes calculating the side-band suppressed spectrum signal according to the N/2 positive gradient scanning signals that have undergone the eddy current correction and the N/2 negative gradient scanning signals that have undergone the eddy current correction.

Preferably, the determination of the positive eddy current correction factor includes: positive reference scanning P times by a positive gradient and collecting the positive reference signal during the $P^{th}$ positive reference scan, wherein P is a positive integer greater than 1, and then filtering said positive reference signal and taking the filtered signal phase as the positive eddy current correction factor.

According to an embodiment, the filtering includes: acquiring the sampling interval of the positive reference scan to acquire the mechanical vibration frequency of the magnet; calculating the product of the positive reference scanning sampling interval and the mechanical vibration frequency of the magnet, and then calculating the reciprocal of the product and taking the result as the length of the sliding window, designing the mean sliding filter according to the length of the sliding window; and performing mean sliding filtering of the positive reference signal with said mean sliding filter.

Preferably, the acquisition of the mechanical vibration frequency of the magnet includes: taking a spectrum measurement of the water modeling using a Point-Resolved Spectroscopy (PRESS) sequence, to get the spectrum of the water modeling signal, calculating the absolute value of the frequency difference between the water peak and any nearest side band in said spectrum, and taking the absolute value as the mechanical vibration frequency of the magnet.

According to another embodiment, the filtering includes: calculating the positive filtering bandwidth, designing a Gaussian band-pass filter according to said positive filtering bandwidth, and band-pass filtering the positive reference signal with the Gaussian band-pass filter.

Preferably, the calculation of the positive filtering bandwidth includes: acquiring the spectrum of the positive reference scan; if there is no overlapping part between the water signal and the metabolite signal in the positive reference scanning spectrum, the waveband of the water signal is acquired and taken as the positive filtering bandwidth; if there is an overlapping part between the water signal and the metabolite signal in the positive reference scanning spectrum, the overlapping waveband between the water signal and the metabolite signal is first divided by 2 to acquire a quotient, and then the difference between the waveband of the water signal and the quotient is calculated and the result is taken as the positive filtering bandwidth.

Preferably, the determination of the negative eddy current correction factor includes: negative reference scanning P times by a negative gradient and collecting the negative reference signal during the $P^{th}$ negative reference scan, wherein P is a positive integer greater than 1, filtering the negative reference signal and taking the filtered signal phase as the negative eddy current correction factor.

In an embodiment, the filtering includes: acquiring the sampling interval of the negative reference scan to acquire the mechanical vibration frequency of the magnet, calculating the product of said negative reference scanning sampling interval and the mechanical vibration frequency of the magnet, and then calculating the reciprocal of the product and taking the result as the length of the sliding window, designing a mean sliding filter according to the length of the sliding window, and mean sliding filtering the negative reference signal with said mean sliding filter.

Preferably, the acquisition of the mechanical vibration frequency of the magnet includes: taking a spectrum measurement of the water modeling using a Point-Resolved Spectroscopy (PRESS) sequence, to get the spectrum of the water modeling signal, calculating the absolute value of the frequency difference between the water peak and any nearest side band in the spectrum, and taking that absolute value as the mechanical vibration frequency of the magnet.

In another embodiment, the filtering includes: calculating the negative filtering bandwidth, and designing a Gaussian band-pass filter according to the negative filtering bandwidth; band-pass filtering of the negative reference signal with the Gaussian band-pass filter.

Preferably, the calculation of the negative filtering bandwidth includes: acquiring the spectrum of the negative reference scan; if there is no overlapping part between the water signal and the metabolite signal in the negative reference scanning spectrum, the waveband of the water signal is acquired and taken as the negative filtering bandwidth, if there is an overlapping part between the water signal and the metabolite signal in the negative reference scanning spectrum, the overlapping waveband between the water signal and the metabolite signal is first divided by 2 to acquire a quotient, and then the difference between the waveband of the water signal and said quotient is calculated, and the result is taken as the negative filtering bandwidth.

Preferably, the eddy current correction of the positive gradient scanning signal includes: calculating the difference between the phase of said positive gradient scanning signal and said positive eddy current correction factor. The eddy current correction of the negative gradient scanning signal includes: calculating the difference between the phase of the negative gradient scanning signal and the negative eddy current correction factor.

Preferably, the calculation of the side-band suppressed spectrum signal includes: adding the N/2 positive gradient scanning signals that have undergone the eddy current correction and the N/2 negative gradient scanning signals that have undergone the eddy current correction, and then calculating the average value and taking the result as the side-band suppressed spectrum signal.

The present invention also provides a side-band suppression device, which comprises: a positive eddy current correction factor determining module, a negative eddy current correction factor determining module, a positive gradient scanning signal collecting module, a negative gradient scanning signal collecting module, a positive eddy current correcting module, a negative eddy current correcting module, and a side-band suppressing module.

The positive eddy current correction factor determining module is used for determining the positive eddy current correction factor.

The negative eddy current correction factor determining module is used for determining the negative eddy current correction factor, The positive gradient scanning signal collecting module is used to scan N/2 times by a positive gradient, and to collect the positive gradient scanning signal during each scan, wherein N is an even number.

The negative gradient scanning signal collecting module is used to scan N/2 times by a negative gradient, and to collect the negative gradient scanning signal during each scan.

The positive eddy current correcting module is used for eddy current correcting of the N/2 positive gradient scanning signals collected according to the positive eddy current correction factor.

The negative eddy current correcting module is used for eddy current correcting of the N/2 negative gradient scanning signals collected according to the negative eddy current correction factor.

The side-band suppressing module is used for calculating the side-band suppressed spectrum signal according to the N/2 positive gradient scanning signals that have undergone the eddy current correction and the N/2 negative gradient scanning signals that have undergone the eddy current correction.

The positive eddy current correction factor determining module includes: a positive reference scanning sub-module and a positive filtering sub-module, the positive reference scanning sub-module being used to perform positive reference scanning P times by a positive gradient, and to collect the positive reference signal during the $P^{th}$ positive reference scan, wherein P is a positive integer greater than 1. The positive filtering sub-module is used for filtering the positive reference signal and taking the filtered signal phase as the positive eddy current correction factor.

The positive filtering sub-module includes: a positive sampling interval acquiring unit, a mechanical vibration frequency acquiring unit, a positive sliding window calculating unit, a mean filter designing unit, and a positive mean sliding filtering unit. The positive sampling interval acquiring unit is used for acquiring the sampling interval of the positive reference scan. The mechanical vibration frequency acquiring unit is used for acquiring the mechanical vibration frequency of the magnet. The positive sliding window calculating unit is used for calculating the product of said sampling interval of the positive reference scan and said mechanical vibration frequency of the magnet, and then calculating the reciprocal of the product and taking the result as the length of the sliding window; said mean sliding filter designing unit is used for designing a mean sliding filter according to the length of the sliding window. The said positive mean sliding filtering unit is used for mean sliding filtering of said positive reference signal with the mean sliding filter.

The mechanical vibration frequency acquiring unit includes: a spectrum measuring sub-unit and a calculating sub-unit. The spectrum measuring sub-unit is used for taking a spectrum measurement of the water modeling using a Point-Resolved Spectroscopy (PRESS) sequence, to get the spectrum of the water modeling signal. The calculating unit is used for calculating the absolute value of the frequency difference between the water peak and any nearest side band in said spectrum, and taking that absolute value as said mechanical vibration frequency of the magnet.

The positive filtering sub-module includes: a positive filtering bandwidth calculating unit, a positive band-pass filter designing unit, and a positive band-pass filtering unit. The positive filtering bandwidth calculating unit is used for calculating the positive filtering bandwidth. The positive band-pass filter designing unit is used for designing a Gaussian band-pass filter according to the positive filtering bandwidth. The positive band-pass filtering unit is used for band-pass filtering of the positive reference signal with said Gaussian band-pass filter.

The positive filtering bandwidth calculating unit includes: a positive spectrum acquiring sub-unit and a positive calculating sub-unit. The positive spectrum acquiring sub-unit is used for acquiring the spectrum of the positive reference scan. The positive calculating sub-unit is used for judging whether there is an overlapping part between the water signal and the metabolite signal in the positive reference scanning spectrum, and if there is an overlapping part, the waveband of the water signal is acquired and taken as the positive filtering bandwidth. Otherwise, the overlapping waveband between the water signal and the metabolite signal is divided by 2 to acquire a quotient, and the difference between the waveband of the water signal and the quotient is calculated, and the result is taken as the positive filtering bandwidth.

The negative eddy current correction factor determining module includes: a negative reference scanning sub-module and a negative filtering sub-module. The negative reference scanning sub-module is used to perform negative reference scanning P times by a negative gradient, and to collect the negative reference signal during the $P^{th}$ negative reference scan, wherein P is a positive integer greater than 1. The negative filtering sub-module is used for filtering the negative reference signal and taking the filtered signal phase as the negative eddy current correction factor.

The negative filtering sub-module includes: a negative sampling interval acquiring unit, a mechanical vibration frequency acquiring unit, a negative sliding window calculating unit, a mean filter designing unit, and a negative mean sliding filtering unit. The negative sampling interval acquiring unit is used for acquiring the sampling interval of the negative reference scan. The mechanical vibration frequency acquiring unit is used for acquiring the mechanical vibration frequency of the magnet. The negative sliding window calculating unit is used for calculating the product of said sampling interval of the negative reference scan and the mechanical vibration frequency of the magnet, and then calculating the reciprocal of the product and taking the result as the length of the sliding window. The mean sliding filter designing unit is used for designing a mean sliding filter according to said length of the sliding window. The negative mean sliding filtering unit is used for mean sliding filtering of the negative reference signal with the mean sliding filter.

The mechanical vibration frequency acquiring unit includes: a spectrum measuring sub-unit and a calculating unit. The spectrum measuring sub-unit is used for taking a spectrum measurement of the water modeling using a PRESS sequence to get the spectrum of the water modeling signal. The calculating unit is used for calculating the absolute value of the frequency difference between the water peak and any nearest side band in the spectrum, and taking that absolute value as the mechanical vibration frequency of the magnet.

The negative filtering sub-module includes: a negative filtering bandwidth calculating unit, a negative band-pass filter designing unit, and a negative band-pass filtering unit. The negative filtering bandwidth calculating unit is used for calculating the negative filtering bandwidth. The negative band-pass filter designing unit is used for designing a Gaussian band-pass filter according to the negative filtering bandwidth. The said negative band-pass filtering unit is used for band-pass filtering of the negative reference signal with the Gaussian band-pass filter.

The negative filtering bandwidth calculating unit includes: a negative spectrum acquiring sub-unit and a negative calculating sub-unit. The, negative spectrum acquiring sub-unit is used for acquiring the spectrum of the negative reference scan. The negative calculating sub-unit is used for judging whether there is an overlapping part between the water signal and the metabolite signal in the negative reference scanning spectrum, and if there is an overlapping part, the waveband of the water signal is acquired and taken as the negative filtering bandwidth. Otherwise, the overlapping waveband between the water signal and the metabolite signal is divided by 2 to acquire a quotient, and the difference between the waveband of the water signal and the quotient is calculated, and the result is taken as the negative filtering bandwidth.

The positive eddy current correction module includes: a positive receiving sub-module and a positive subtracting sub-module. The positive receiving sub-module is used for receiving the positive gradient scanning signal and said positive eddy current correction factor. The positive subtracting sub-module is used for calculating the difference between the phase of the positive gradient scanning signal and the positive eddy current correction factor.

The negative eddy current correction module includes: a negative receiving sub-module and a negative subtracting sub-module. The negative receiving sub-module is used for receiving the negative gradient scanning signal and the negative eddy current correction factor. The negative subtracting sub-module is used for calculating the difference between the phase of the positive gradient scanning signal and the positive eddy current correction factor.

The side-band suppression module includes: an adding sub-module and an averaging sub-module. The adding sub-module is used for adding the N/2 positive gradient scanning signals that have undergone the eddy current correction and the N/2 negative gradient scanning signals that have undergone the eddy current correction, to acquire a sum. The averaging sub-module is used for calculating the average value of the sum, and taking the result as the side-band suppressed spectrum signal.

It is shown in the above technical scheme that the side-band suppression method and device provided by the present invention first determines the positive eddy current correction factor and negative eddy current correction factor, and then performs eddy current correction of the N/2 positive gradient scanning signals collected according to the positive eddy current correction factor, and performs eddy current correction of the N/2 negative gradient scanning signals collected according to the negative eddy current correction factor, and thus the impact of eddy current on the positive and negative gradient scanning signals can be eliminated. This can ensure that the positive and negative scanning signals will have consistent initial phases and that the phase difference of side-band signals will be 180 degrees in both positive and negative gradient scanning. Finally the side-band suppressed spectrum signal is calculated according to the eddy current corrected N/2 positive gradient scanning signals and eddy current corrected N/2 negative gradient scanning signals. In other words, the side-band signals can be completely canceled out by calculation, which means side bands are effectively suppressed.

BRIEF DESCRIPTION OF THE DRAWINGS

FIG. 1 is a flowchart of an embodiment of a side-band suppression method provided by the present invention.

FIG. 2 is a flowchart of the method for determining the positive eddy current correction factor in a side-band suppression method provided by the present invention.

FIG. 3 is a schematic diagram of the positive reference scanning.

FIG. 5 is a flowchart of the method for determining the negative eddy current correction factor in the side-band suppression method provided by the present invention.

FIG. 6 is a schematic diagram of the negative reference scanning.

DESCRIPTION OF THE PREFERRED EMBODIMENTS

Figure 4A:
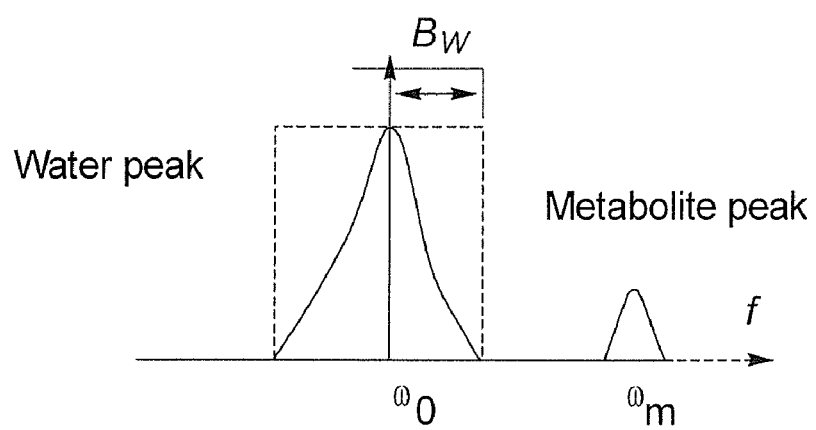
FIG. 4a is a schematic diagram showing how positive filtering bandwidth is calculated when the water signal and metabolite signal do not overlap.

FIG. 1 is a flowchart of the embodiment of a side-band suppression method provided by the present invention, and as shown in FIG. 1, the flow includes the following steps:

step 101, determining the positive eddy current correction factor and negative eddy current correction factor.

FIG. 2 is a flowchart of the method for determining the positive eddy current correction factor in a side-band suppression method provided by the present invention, and as shown in FIG. 2, the flow includes the following step:

Step 1011, positive reference scanning P times by a positive gradient and collecting the positive reference signal during the $P^{th}$ positive reference scan, wherein P is a positive integer greater than 1 and may vary depending on the actual needs.

It should be noted that in the present invention, the positive means adopting a positive gradient, and the negative means adopting a negative gradient.

FIG. 3 is a schematic diagram of the positive reference scanning, wherein the first P-1 positive reference scans are to stabilize the system, and the positive reference signal is collected during the $P^{th}$ positive reference scan.

The positive reference scanning is a scanning method satisfying the following conditions: first, there is no water peak suppression; second, the excitation frequency of the system equals the resonance frequency of water protons. The specific scanning method is a prior art and will not be further described herein.

Step 1012, filtering the positive reference signal and taking the filtered signal phase as the positive eddy current correction factor.

The filtering step can be performed at the time domain of the reference signal or the frequency domain. Filtering methods in the different domains will be introduced below.

First, the time-domain filtering method will be described.

During the positive scanning, the positive reference signal phase is composed of two parts, which can be expressed by $\phi_{ref}^{+}(t)=\phi_N^{+}(t)+\phi_P^{+}(t)$, wherein $\phi_{ref}^{+}(t)$ is the positive reference signal phase, $\phi_N^{+}(t)$ is the phase of the low-frequency a periodic signal during the positive reference scanning, and $\phi_P^{+}(t)$ is the phase of the high-frequency periodic signal during the positive reference scanning, wherein $\phi_N^{+}(t)=\phi_0^{+}+\phi_{\Delta f}^{+}(t)+\phi_{EC}^{+}(t)$, wherein $\phi_{\Delta f}^{+}(t)$ is the signal phase caused by the inhomogeneity of the magnetic field in the voxel during the positive reference scanning, $\phi_{EC}^{+}(t)$ is the signal phase caused by the eddy current during the positive reference scanning, and $\phi_0^{+}$ is the positive fixed compensated phase which does not change over time; and $\phi_P^{+}(t)=\phi_V^{+}(t)+\phi_m^{+}(t)$, wherein $\phi_V^{+}(t)$ is the signal phase caused by the oscillation of the main magnet field during the positive reference scanning, and $\phi_m^{+}(t)$ is the phase of the metabolite signal during the positive reference scanning.

In this step, the purpose of filtering is to filter $\phi_P^{+}(t)$ from $\phi_{ref}^{+}(t)$ so that the filtered signal phase contains only $\phi_N^{+}(t)$. The filtering method adopted is the mean sliding filtering method. The following will describe the mean sliding filtering method used in this step.

First, the sliding window length is calculated by $l=1/(f_v * \Delta T)$, wherein $f_v$ is the mechanical vibration frequency of the magnet and $\Delta T$ is the sampling interval of the positive reference scanning. In the present invention, the sampling intervals of the positive reference scanning and negative reference scanning are the same, and $\Delta T$ can be known before the positive reference scanning. $f_v$ is obtained by the following method: the spectrum measurement of the water modeling can use a common Point-Resolved Spectroscopy (PRESS) sequence as the scanning sequence to get the spectrum of the water modeling signal. The absolute value of the frequency difference between the water peak and any nearest side band in the spectrum is $f_v$ (taking into consideration the first-order side bands only and ignoring the second or higher order side bands). It should be noted that in the spectrum there are two nearest side bands on both sides of the water peak and that the distance between each side band and the water peak is equal. Therefore, $f_v$ can be obtained by selecting any nearest side band and calculating the absolute value of the frequency difference between the water peak and the selected side band. Then, a mean sliding filter is designed according to the sliding window length l, and the designed mean filter is used for filtering $\phi_P^{+}(t)$ from $\phi_{ref}^{+}(t)$. In this case, the design of the mean sliding filter according to the sliding window length and the mean sliding filter filtering method used are part of the prior art and are not further described herein.

Finally, the filtered signal phase is taken as the positive eddy current correction factor, that is, let the positive eddy current correction factor be $q^{+}=\phi_N^{+}(t)$.

As $q^{+}=\phi_N^{+}(t)$ and $\phi_N^{+}(t)=\phi_0^{+}+\phi_{\Delta f}^{+}(t)+\phi_{EC}^{+}(t)$, the positive eddy current correction factor in the present invention can not only correct the signal phase caused by the eddy current in the positive reference scanning, but can also correct the signal phase and the positive fixed compensated phase caused by inhomogeneity of the magnetic field in the voxel during the positive reference scanning, wherein the correction of the signal phase caused by inhomogeneity of the magnetic field in the voxel during the positive reference scanning can reduce the full width at half maximum (FWHM) of the spectral line, thereby improving the resolution and signal-to-noise ratio (SNR) of the spectrum signals. Furthermore, the correction of the positive fixed compensated phase is necessary. After the signal demodulation, water protons should be in the resonance state and their signal phase should also be zero. If the positive fixed compensated phase exists, the real part signals of water protons in the frequency domain are not of pure absorption linear shape and will have distortion. This also causes difficulty in the observation and evaluation of the spectrum.

Next, the frequency domain filtering method is described.

During the positive reference scanning, the positive reference signal phase is composed of two parts:

$$S_{ref}^+(t) = A_W^+(t)\exp(j*\omega_0 t + j*\phi_e^+(t)) + A_m^+(t)\exp(j*\omega_m t + j*\phi_e^+(t))$$

In this case, $S_{ref}^+(t)$ is the positive reference signal, $A_W^+(t)$ is the water signal amplitude during the positive reference scanning, $\omega_0$ is the resonance frequency of water protons, $\phi_e^+(t)$ is the phase signal caused by the eddy current during the positive reference scanning, $A_m^+(t)$ is the metabolite signal amplitude during the positive reference scanning, and $\omega_m$ is the resonance frequency of the metabolites.

Figure 4B:
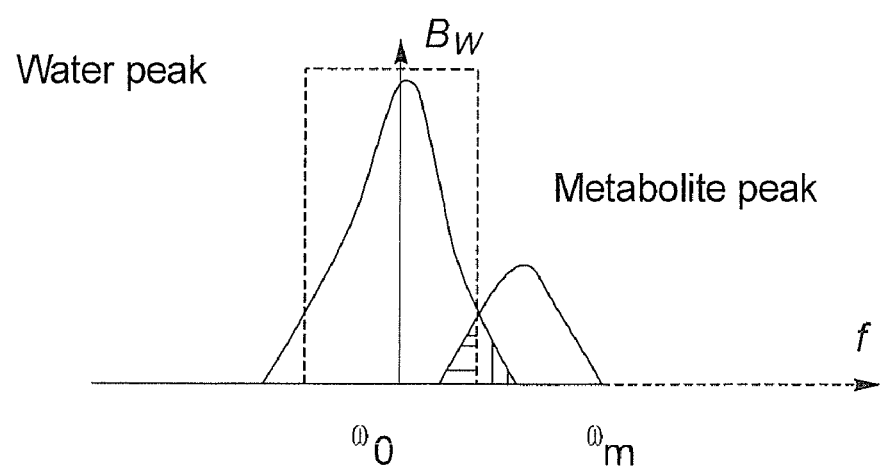
FIG. 4b is a schematic diagram showing how positive filtering bandwidth is calculated when the water signal and metabolite signal overlap.

Further, it should be noted that $A_W^+(t)\exp(j*\omega_0 t+j*\phi_e^+(t))$ is the water signal $S_W^+(t)$ during the positive reference scanning, and $A_m^+(t)\exp(j*\omega_m t+j*\phi_e^+(t))$ is the metabolite signal $S_m^+(t)$ during the positive reference scanning. In this step, the purpose of filtering is to remove $S_m^+(t)$ so that the filtered signal phase contains only $S_W^+(t)$. The details of the filtering method are: first, calculate the positive filtering bandwidth $B_W^+$ according to the spectrum of the positive reference scanning, wherein the acquisition of the spectrum of the positive reference scanning is prior art. There are two scenarios of $B_W^+$ calculation. FIG. 4a is a diagram showing the positive filtering bandwidth calculation when the water signal and metabolite signal do not overlap. As shown in FIG. 4a, if there is no overlapping part between the water signal and the metabolite signal during the positive reference scanning, the waveband of the water signal during the positive reference scanning is $B_W^+$. FIG. 4b is a diagram showing the positive filtering bandwidth calculation when the water signal and metabolite signal overlap. As shown in FIG. 4b, if there is an overlapping part between the water signal and the metabolite signal during the positive reference scanning, $B_W^+$=(water signal waveband in positive reference scanning)−(overlapping waveband between the water signal and the metabolite signal during positive reference scanning)/2. Then, a Gaussian band-pass filter is designed according to the calculated positive filtering bandwidth with the center of the water signal as the center of the filter, and the designed Gaussian band-pass filter is used to remove the metabolite signal from the positive reference signal in the frequency domain so that the positive reference signal contains only $S_W^+(t)$. In this case, the method for designing the Gaussian band-pass filter according to the filter bandwidth and the method of using the Gaussian band-pass filter for filtering belong to the prior art which is not further described herein.

If the excitation frequency of the system equals the resonance frequency of water protons, i.e. $\omega_0=0$, then $S_W^+(t)=A_W^+(t)\exp(j*\phi_e^+(t))$, from which it can be known that $$\varphi_e^+(t) = arctg\left(\frac{\text{imag}(S_w^+(t))}{\text{real}(S_w^+(t))}\right),$$

wherein the method for acquiring the real part and imaginary part of $S_W^+(t)$ is prior art which will not be further described herein.

Finally, let the positive eddy current correction factor be $q^+=\omega_e^+(t)$, that is, the filtered signal phase is taken as the positive eddy current correction factor. This concludes the description of the method for determining the positive eddy current correction factor and next the method for determining the negative eddy current correction factor will be described.

FIG. 5 is a flowchart of the method for determining the negative eddy current correction factor in a side-band suppression method provided by the present invention, as shown in FIG. 5, it includes the following step:

Step 1013, negative reference scanning P times by a negative gradient and collecting the negative reference signal during the $P^{th}$ negative reference scan, wherein P is a positive integer greater than 1.

FIG. 6 is a schematic diagram of the negative reference scanning, wherein the purpose of the first P-1 negative reference scans is to stabilize the system and the negative reference signal is collected during the $P^{th}$ negative reference scan.

Step 1014, filtering the negative reference signal and taking the filtered signal phase as the negative eddy current correction factor.

The technical features of step 1013 correspond to those of step 1011, and the technical features of step 1014 correspond to those of step 1012, thus for the description of step 1013 and step 1014 reference can be made to the corresponding description of step 1011 and step 1012.

In step 101, the process of determining the positive eddy current correction factor and that of determining the negative eddy current correction factor can be carried out simultaneously (for example, steps 1011 and 1012 and steps 1013 and 1014 can be performed alternately) or in tandem, and the present invention is not limited to this.

This concludes the description of step 101.

Step 102 involves scanning N/2 times by a positive gradient, and collecting the positive gradient scanning signal during each scan; scanning N/2 times by a negative gradient, and collecting the negative gradient scanning signal during each scan, wherein, N is an even number.

This step belongs to the prior art which will not be further described herein.

Step 103 involves eddy current correcting of the N/2 positive gradient scanning signals according to the positive eddy current correction factor; eddy current correcting of the N/2 negative gradient scanning signals according to the negative eddy current correction factor.

The method for eddy current correction of the positive gradient scanning signal is: subtracting the positive eddy current correction factor from the phase of the positive gradient scanning signal and taking the difference value obtained as the phase of the positive gradient scanning signal which has undergone the eddy current correction. The amplitude of the positive gradient scanning signal is not changed, i.e. $S^{corr+}(t)=S^+(t)*\exp(-i*q^+)$ wherein $S^+(t)$ is the positive gradient scanning signal and (t) is the positive gradient scanning signal which has undergone the eddy current correction.

The method for eddy current correction of the negative gradient scanning signal is: subtracting the negative eddy current correction factor from the phase of the negative gradient scanning signal and taking the difference value obtained as the phase of negative gradient scanning signal which has undergone the eddy current correction. The amplitude of the negative gradient scanning signal is not changed, i.e. $S^{corr-}(t)=S^-(t)*\exp(-i*q^-)$ wherein $S^-(t)$ is the negative gradient scanning signal and $S^{corr-}(t)$ is the negative gradient scanning signal which has undergone the eddy current correction.

In the method of this embodiment, the step of eddy current correction of the N/2 positive gradient scanning signals can also be performed after step 102, collecting the positive gradient scanning signals. The present invention is not limited to the order of steps stated above.

Step 104 involves calculating the side-band suppressed spectrum signal according to the N/2 positive gradient scanning signals that have undergone the eddy current correction and the N/2 negative gradient scanning signals that have undergone the eddy current correction.

The method for calculating the side-band suppressed spectrum signal is: adding up the N/2 positive gradient scanning signals that have undergone the eddy current correction and the N/2 negative gradient scanning signals that have undergone the eddy current correction, and then calculating the average value and taking the result as the side-band suppressed spectrum signal.

Figure 7:
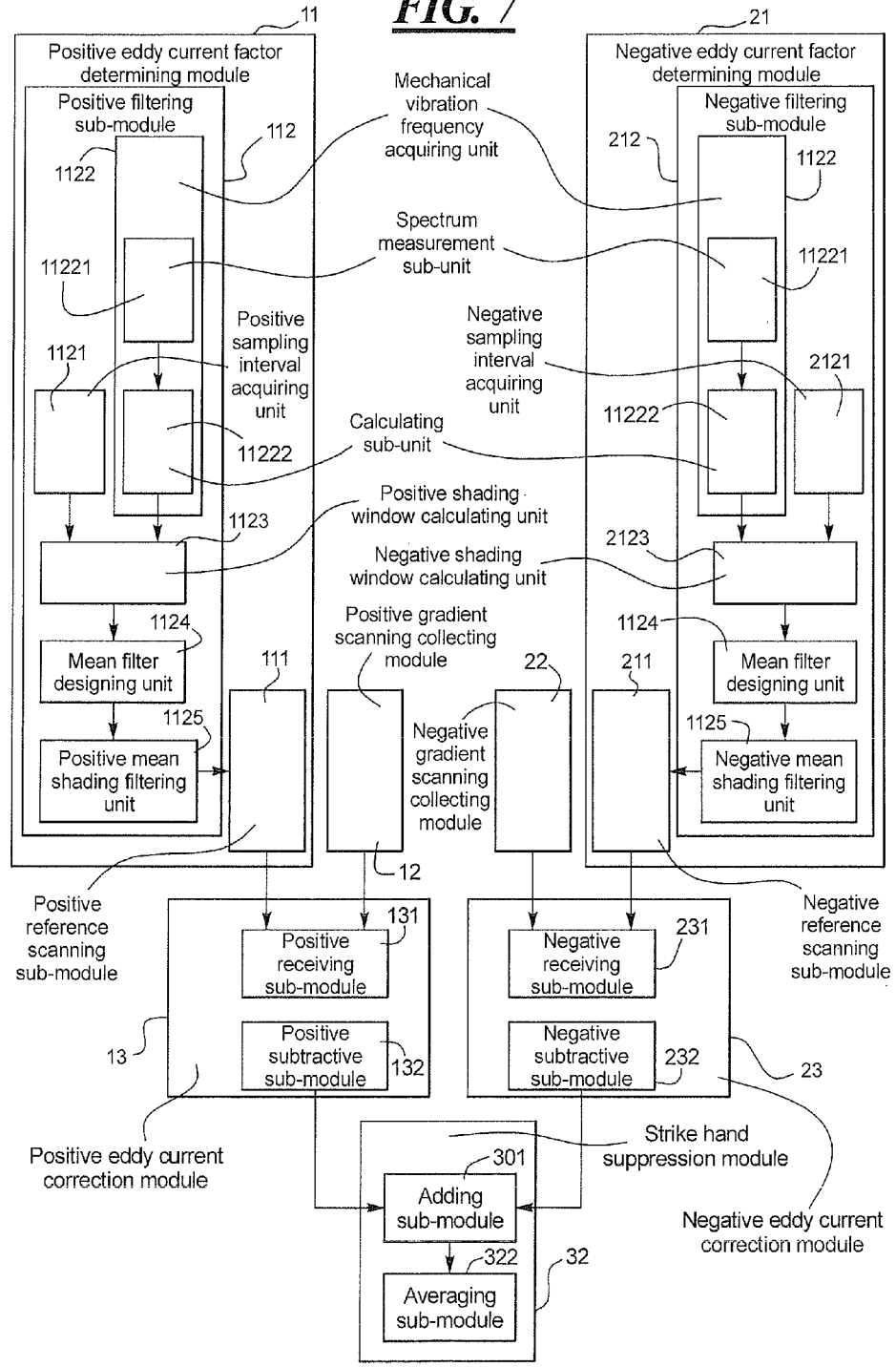
FIG. 7 is a diagram showing the structure of the first preferred embodiment of a side-band suppression device provided by the present invention.

Based on the above side-band suppression method, FIG. 7 is a diagram showing the structure of the first preferred embodiment of the side-band suppression device according to the present invention. As shown in FIG. 7, the device includes: a positive eddy current correction factor determining module 11, a negative eddy current correction factor determining module 21, a positive gradient scanning signal collecting module 12, a negative gradient scanning signal collecting module 22, a positive eddy current correcting module 13, a negative eddy current correcting module 23, and a side-band suppressing module 30.

In this case, the positive eddy current correction factor determining module 11 is used for determining the positive eddy current correction factor; the negative eddy current correction factor determining module 21 is used for determining the negative eddy current correction factor; the positive gradient scanning signal collecting module 12 is used to scan N/2 times by a positive gradient, and to collect the positive gradient scanning signal during each scan, wherein N is an even number; the negative gradient scanning signal collecting module 22 is used to scan N/2 times by a negative gradient, and to collect the negative gradient scanning signal during each scan; the positive eddy current correcting module 13 is used for eddy current correcting of the N/2 positive gradient scanning signals collected according to the positive eddy current correction factor; the negative eddy current correcting module 23 is used for eddy current correcting of the N/2 negative gradient scanning signals collected according to the negative eddy current correction factor; and the side-band suppressing module 30 is used for calculating the side-band suppressed spectrum signal according to the N/2 positive gradient scanning signals that have undergone the eddy current correction and the N/2 negative gradient scanning signals that have undergone the eddy current correction.

The positive eddy current correction factor determining module 11 includes: a positive reference scanning sub-module 111 and a positive filtering sub-module 112.

In this case, the positive reference scanning sub-module 111 is used to perform positive reference scanning P times by a positive gradient, and to collect the positive reference signal during the $P^{th}$ positive reference scan, wherein P is a positive integer greater than 1; and, the positive filtering sub-module 112 is used for filtering the positive reference signal and taking the filtered signal phase as the positive eddy current correction factor.

The positive filtering sub-module 112 includes: a positive sampling interval acquiring unit 1121, a mechanical vibration frequency acquiring unit 1122, a positive sliding window calculating unit 1123, a mean filter designing unit 1124, and a positive mean sliding filtering unit 1125.

In this case, the positive sampling interval acquiring unit 1121 is used for acquiring the sampling interval of the positive reference scan; the mechanical vibration frequency acquiring unit 1122 is used for acquiring the mechanical vibration frequency of the magnet; the positive sliding window calculating unit 1123 is used for calculating the product of the sampling interval of the positive reference scanning and the mechanical vibration frequency of the magnet, and then calculating the reciprocal of the product and taking the result as the length of the sliding window; the mean sliding filter designing unit 1124 is used for designing a mean sliding filter according to the length of the sliding window; and the positive mean sliding filtering unit 1125 is used for mean sliding filtering of the positive reference signal with the designed mean sliding filter.

The mechanical vibration frequency acquiring unit 1122 includes: a spectrum measuring sub-unit 11221 and a calculating sub-unit 11222.

In this case, the spectrum measuring sub-unit 11221 is used for taking a spectrum measurement of the water modeling using a PRESS sequence, to get the spectrum of the water modeling signal; and the calculating unit 11222 is used for calculating the absolute value of the frequency difference between the water peak and any nearest side band in the spectrum, and taking that absolute value as the mechanical vibration frequency of the magnet.

The negative eddy current correction factor determining module 21 includes: a negative reference scanning sub-module 211 and a negative filtering sub-module 212.

In this case, the negative reference scanning sub-module 211 is used to perform the negative reference scanning P times by a negative gradient, and to collect the negative reference signal during the $P^{th}$ negative reference scan, wherein P is a positive integer greater than 1; and, the negative filtering sub-module 212 is used for filtering the negative reference signal and taking the filtered signal phase as the negative eddy current correction factor.

The negative filtering sub-module 212 includes: a negative sampling interval acquiring unit 2121, a mechanical vibration frequency acquiring unit 1122, a negative sliding window calculating unit 2123, a mean sliding filter designing unit 1124, and a negative mean sliding filtering unit 2125.

In this case, the negative sampling interval acquiring unit 2121 is used for acquiring the sampling interval of the negative reference scan; the mechanical vibration frequency acquiring unit 1122 is used for acquiring the mechanical vibration frequency of the magnet; the negative sliding window calculating unit 2123 is used for calculating the product of the sampling interval of the negative reference scanning and the mechanical vibration frequency of the magnet, and then calculating the reciprocal of the product and taking the result as the length of the sliding window; the mean sliding filter designing unit 1124 is used for designing a mean sliding filter according to the length of the sliding window; and the negative mean sliding filtering unit 2125 is used for mean sliding filtering of the negative reference signal with the designed mean sliding filter.

The mechanical vibration frequency acquiring unit 1122 includes: a spectrum measuring sub-unit 11221 and a calculating unit 1222.

In this case, the spectrum measuring sub-unit 11221 is used for taking a spectrum measurement of the water modeling with a PRESS sequence, to get the spectrum of the water modeling signal; and the calculating unit 11222 is used for calculating the absolute value of the frequency difference between the water peak and any nearest side band in the spectrum, and taking that absolute value as the mechanical vibration frequency of the magnet.

The positive eddy current correcting module 13 includes: a positive receiving sub-module 131 and a positive subtracting sub-module 132.

In this case, the positive receiving sub-module 131 is used for receiving the positive gradient scanning signal and the positive eddy current correction factor; and the positive subtracting sub-module 132 is used for calculating the difference between the phase of the positive gradient scanning signal and the positive eddy current correction factor.

The negative eddy current correction module 23 includes: a negative receiving sub-module 231 and a negative subtracting sub-module 232.

In this case, the negative receiving sub-module 231 is used for receiving the negative gradient scanning signal and the negative eddy current correction factor; and the negative subtracting sub-module 232 is used for calculating the difference between the phase of the positive gradient scanning signal and the positive eddy current correction factor.

The side-band suppression module 30 includes: an adding sub-module 301 and an averaging sub-module 302.

In this case, the adding sub-module 301 is used for adding up the N/2 positive gradient scanning signals that have undergone the eddy current correction and the N/2 negative gradient scanning signals that have undergone the eddy current correction, to acquire the sum; and the averaging sub-module 302 is used for calculating the average value of the sum, and taking the result as the side-band suppressed spectrum signal.

Figure 8:
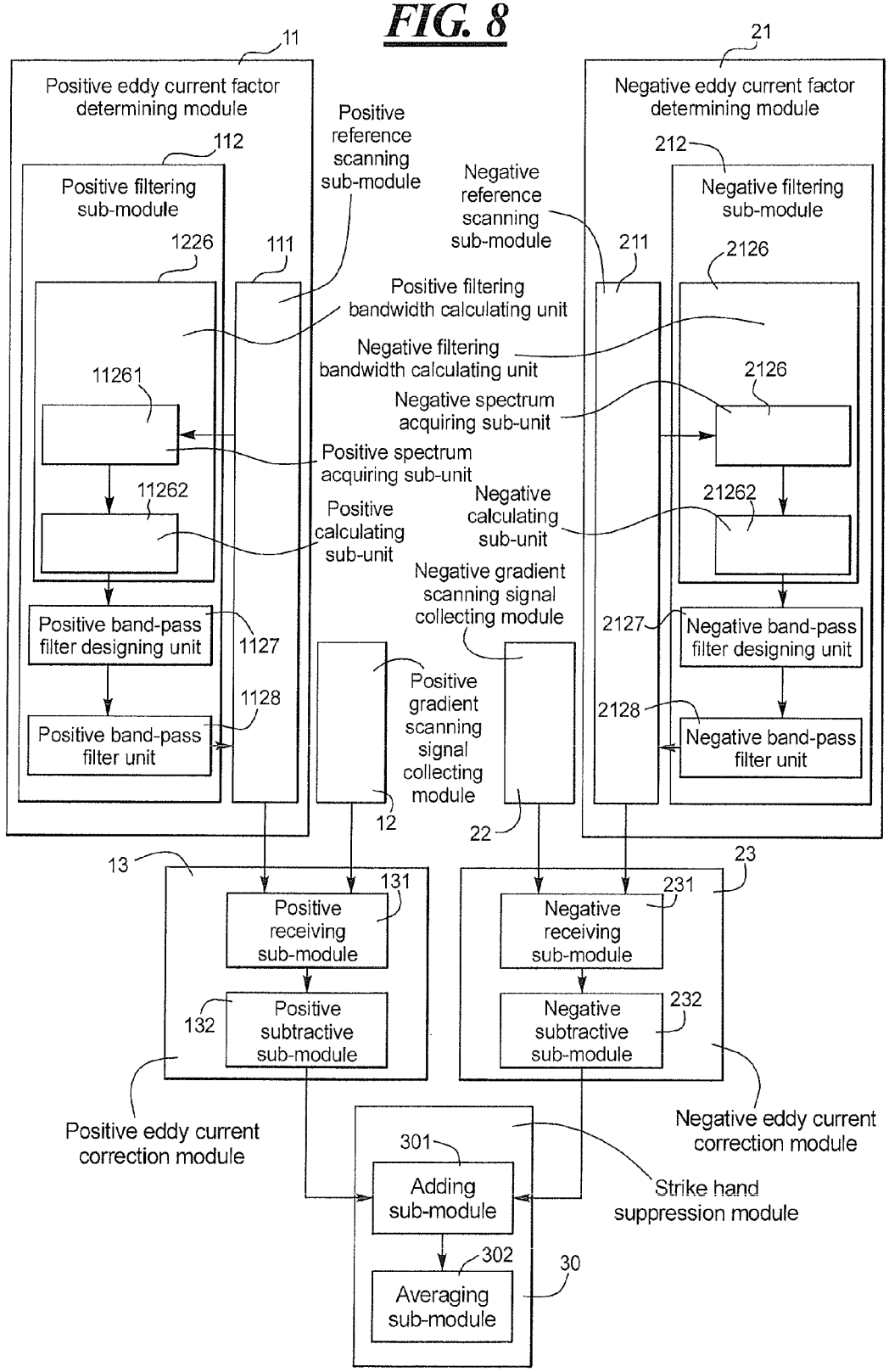
FIG. 8 is a diagram showing the structure of the second preferred embodiment of a side-band suppression device provided by the present invention.

FIG. 8 is a structural diagram of the second preferred embodiment of a side-band suppression device provided by the present invention. As shown in FIG. 8, the device includes: a positive eddy current correction factor determining module 11, a negative eddy current correction factor determining module 21, a positive gradient scanning signal collecting module 12, a negative gradient scanning signal collecting module 22, a positive eddy current correcting module 13, a negative eddy current correcting module 23, and a side-band suppressing module 30.

In this case, the positive eddy current correction factor determining module 11 is used for determining the positive eddy current correction factor; the negative eddy current correction factor determining module 21 is used for determining the negative eddy current correction factor; the positive gradient scanning signal collecting module 12 is used to scan N/2 times by a positive gradient, and to collect the positive gradient scanning signal during each scan, wherein N is an even number; the negative gradient scanning signal collecting module 22 is used to scan N/2 times by a negative gradient, and to collect the negative gradient scanning signal during each scan; the positive eddy current correcting module 13 is used for eddy current correction of the N/2 positive gradient scanning signals collected according to the positive eddy current correction factor; the negative eddy current correcting module 23 is used for eddy current correction of the N/2 negative gradient scanning signals collected according to the negative eddy current correction factor; and the side-band suppressing module 30 is used for calculating the side-band suppressed spectrum signal according to the N/2 positive gradient scanning signals that have undergone the eddy current correction and N/2 negative gradient scanning signals that have undergone the eddy current correction.

The positive eddy current correction factor determining module 11 includes: a positive reference scanning sub-module 111 and a positive filtering sub-module 112.

In this case, the positive reference scanning sub-module 111 is used to perform the positive reference scanning P times by a positive gradient, and to collect the positive reference signal during the $P^{th}$ positive reference scan, wherein P is a positive integer greater than 1; and, the positive filtering sub-module 112 is used for filtering the positive reference signal and taking the filtered signal phase as the positive eddy current correction factor.

The positive filtering sub-module 112 includes: a positive filtering bandwidth calculating unit 1126, a positive band-pass filter designing unit 1127, and a positive band-pass filtering unit 1128.

In this case, the positive filtering bandwidth calculating unit 1126 is used for calculating the positive filtering bandwidth; the positive band-pass filter designing unit 1127 is used for designing a Gaussian band-pass filter according to said positive filtering bandwidth; and the positive band-pass filtering unit 1128 is used for band-pass filtering of said positive reference signal with the Gaussian band-pass filter.

The positive filtering bandwidth calculating unit 1126 includes: a positive spectrum acquiring sub-unit 11261 and a positive calculating sub-unit 11262.

In this case, the positive spectrum acquiring sub-unit 11261 is used for acquiring the spectrum of the positive reference scan; and the positive calculating sub-unit 11262 is used for judging whether there is an overlapping part between the water signal and the metabolite signal in the positive reference scanning spectrum, and if there is an overlapping part, the waveband of the water signal is acquired and taken as the positive filtering bandwidth; otherwise, the overlapping waveband between the water signal and the metabolite signal is divided by 2 to acquire a quotient, and then the difference between the waveband of the water signal and the quotient is calculated, and the result is taken as the positive filtering bandwidth.

The negative eddy current correction factor determining module 21 includes: a negative reference scanning sub-module 211 and a negative filtering sub-module 212.

In this case, the negative reference scanning sub-module 211 is used to perform the negative reference scanning P times by a negative gradient, and to collect the negative reference signal during the $P^{th}$ negative reference scan only, wherein P is a positive integer greater than 1; and, the negative filtering sub-module 212 is used for filtering the negative reference signal and taking the filtered signal phase as the negative eddy current correction factor.

The negative filtering sub-module 212 includes: a negative filtering bandwidth calculating unit 2126, a negative band-pass filter designing unit 2127, and a negative band-pass filtering unit 2128.

In this case, the negative filtering bandwidth calculating unit 2126 is used for calculating the negative filtering bandwidth; the negative band-pass filter designing unit 2127 is used for designing a Gaussian band-pass filter according to said negative filtering bandwidth; and the negative band-pass filtering unit 2128 is used for band-pass filtering of said negative reference signal with the Gaussian band-pass filter.

The negative filtering bandwidth calculating unit 2126 includes: a negative spectrum acquiring sub-unit 21261 and a negative calculating sub-unit 21262.

In this case, the negative spectrum acquiring sub-unit 21261 is used for acquiring the spectrum of the negative reference scan; and the negative calculating sub-unit 21262 is used for judging whether there is an overlapping part between the water signal and the metabolite signal in the negative reference scanning spectrum, and if there is an overlapping part, the waveband of the water signal is acquired and taken as the negative filtering bandwidth; otherwise, the overlapping waveband between the water signal and the metabolite signal is divided by 2 to acquire a quotient, and then the difference between the waveband of the water signal and the quotient is calculated, and the result is taken as the negative filtering bandwidth.

The positive eddy current correcting module 13 includes: a positive receiving sub-module 131 and a positive subtracting sub-module 132.

In this case, the positive receiving sub-module 131 is used for receiving the positive gradient scanning signal and the positive eddy current correction factor; and the positive subtracting sub-module 132 is used for calculating the difference between the phase of the positive gradient scanning signal and the positive eddy current correction factor.

The negative eddy current correction module 23 includes: a negative receiving sub-module 231 and a negative subtracting sub-module 232.

In this case, the negative receiving sub-module 231 is used for receiving the negative gradient scanning signal and the negative eddy current correction factor; and the negative subtracting sub-module 232 is used for calculating the difference between the phase of the positive gradient scanning signal and the positive eddy current correction factor.

The side-band suppression module 30 includes: an adding sub-module 301 and an averaging sub-module 302.

In this case, the adding sub-module 301 is used for adding up the N/2 positive gradient scanning signals that have undergone the eddy current correction and the N/2 negative gradient scanning signals that have undergone the eddy current correction, to acquire a sum; and the averaging sub-module 302 is used for calculating the average value of the sum, and taking the result as the side-band suppressed spectrum signal.

For a detailed description of the embodiment of a side-band suppression device provided by the present invention, refer to the corresponding description of the embodiment of the method shown in FIG. 1 as it will not be further described herein.

It can be seen that based on the above side-band suppression method and device, first the positive eddy current correction factor and negative eddy current correction factor are determined, and then eddy current correction of the N/2 positive gradient scanning signals collected is conducted according to the positive eddy current correction factor, and eddy current correction of the N/2 negative gradient scanning signals collected is conducted according to the negative eddy current correction factor. Thus the impact of eddy current on the positive and negative gradient scanning signals can be eliminated. This ensures that the positive and negative gradient scanning signals have consistent initial phases, and that the phase difference of side-band signals will be 180 degrees during the positive and negative gradient scanning. Finally the side-band suppressed spectrum signals are calculated according to the N/2 positive gradient scanning signals that have undergone the eddy current correction and the N/2 negative gradient scanning signals that have undergone the eddy current correction. Thus, the side-band signals can be completely cancelled out by calculation, meaning that the method and device provided by the present invention can effectively suppress the side bands.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for side-band suppression in magnetic resonance (MR) signals comprising the steps of:
   in a computerized processor, determining a positive eddy current correction factor and a negative eddy current correction factor;
   operating an MR spectroscopic data acquisition unit with an examination subject therein to scan the subject N/2 times with an MR spectroscopic data acquisition sequence comprising a positive gradient, and collecting a positive gradient scanning signal during each scan with the positive gradient and to scan the subject N/2 times with an MR spectroscopic data acquisition sequence comprising a negative gradient, and collecting a negative gradient scanning signal during each scan with the negative gradient, wherein N is an even number;
   in said processor, performing an eddy current correction of the N/2 positive gradient scanning signals collected according to said positive eddy current correction factor, and performing an eddy current correction of the N/2 negative gradient scanning signals collected according to said negative eddy current correction factor; and
   in said processor, calculating a side-band suppressed spectrum signal according to the N/2 positive gradient scanning signals that have undergone the eddy current correction and the N/2 negative gradient scanning signals that have undergone the eddy current correction.

2. The method as claimed in claim 1 wherein:
   determining the positive eddy current correction factor comprises performing positive reference scanning P times by a positive gradient and collecting the positive reference signal during the $P^{th}$ positive reference scan, and then filtering said positive reference signal and taking the filtered signal phase as the positive eddy current correction factor; and
   determining the negative eddy current correction factor comprises performing negative reference scanning P times by a negative gradient and collecting the negative reference signal during the $P^{th}$ negative reference scan, and then filtering said negative reference signal and taking the filtered signal phase as the negative eddy current correction factor;
   wherein P is a positive integer greater than 1.

3. The method as claimed in claim 2, wherein said filtering comprises:
   in said processor, acquiring the sampling interval of the positive/negative reference scan to acquire the mechanical vibration frequency of the magnet;
   in said processor, calculating the product of said positive/negative reference scanning sampling interval and said mechanical vibration frequency of the magnet, and then calculating the reciprocal of the product and taking the result as the length of the sliding window;
   in said processor, designing the mean sliding filter according to said length of the sliding window;
   in said processor, performing mean sliding filtering of said positive/negative reference signal with said mean sliding filter.

4. The method as claimed in claim 3, wherein acquisition of the mechanical vibration frequency of the magnet comprises:
   taking a spectrum measurement of the water modeling using a Point-Resolved Spectroscopy (PRESS) sequence, to obtain a spectrum of the water modeling signal;
   in said processor, calculating the absolute value of the frequency difference between the water peak and any nearest side band in said spectrum, and taking the absolute value as the mechanical vibration frequency of the magnet.

5. The method as claimed in claim 2, wherein said filtering comprises:
   in said processor, calculating the positive/negative filtering bandwidth;
   in said processor, designing a Gaussian band-pass filter according to said positive/negative filtering bandwidth; and
   in said processor, band-pass filtering said positive/negative reference signal with said Gaussian band-pass filter.

6. The method as claimed in claim 5, wherein calculating the positive/negative filtering bandwidth comprises:
acquiring the spectrum of the positive/negative reference scan;
if there is no overlapping part between the water signal and the metabolite signal in the positive/negative reference scanning spectrum, the waveband of the water signal is acquired and taken as the positive/negative filtering bandwidth;
if there is an overlapping part between the water signal and the metabolite signal in the positive/negative reference scanning spectrum, the overlapping waveband between the water signal and the metabolite signal is first divided by 2 to acquire a quotient, and then calculating the difference between the waveband of the water signal and said quotient, and using the result as the positive/negative filtering bandwidth.

7. The method as claimed in claim 1 wherein:
said eddy current correction of the positive gradient scanning signal comprises calculating the difference between the phase of said positive gradient scanning signal and said positive eddy current correction factor;
said eddy current correction of the negative gradient scanning signal comprises calculating the difference between the phase of said negative gradient scanning signal and said negative eddy current correction factor.

8. The method as claimed in claim 1 wherein said calculation of the side-band suppressed spectrum signal comprises adding the N/2 positive gradient scanning signals that have undergone said eddy current correction and the N/2 negative gradient scanning signals that have undergone said eddy current correction, and then calculating an average value and using the result as the side-band suppressed spectrum signal.

9. A side-band suppression device, comprising:
in a computerized processor configured to determine a positive eddy current correction factor and a negative eddy current correction factor;
an MR spectroscopic data acquisition unit adapted to receive an examination subject therein;
a control unit that operates said MR spectroscopic data acquisition unit to scan the subject N/2 times with an MR spectroscopic data acquisition sequence comprising a positive gradient, and to collect a positive gradient scanning signal during each scan with the positive gradient, and to scan the subject N/2 times with an MR spectroscopic data acquisition sequence comprising a negative gradient, and to collect a negative gradient scanning signal during each scan with the negative gradient, wherein N is an even number;
said processor being configured to perform an eddy current correction of the N/2 positive gradient scanning signals collected according to said positive eddy current correction factor, and performing an eddy current correction of the N/2 negative gradient scanning signals collected according to said negative eddy current correction factor; and
said processor being configured to calculate a side-band suppressed spectrum signal according to the N/2 positive gradient scanning signals that have undergone the eddy current correction and the N/2 negative gradient scanning signals that have undergone the eddy current correction.

10. The device as claimed in claim 9 said processor is configured to:
determine the positive eddy current correction factor comprises by performing positive reference scanning P times by a positive gradient and collecting the positive reference signal during the $P^{th}$ positive reference scan, and then filtering said positive reference signal and taking the filtered signal phase as the positive eddy current correction factor; and
determine the negative eddy current correction factor comprises by performing negative reference scanning P times by a negative gradient and collecting the negative reference signal during the $P^{th}$ negative reference scan, and then filtering said negative reference signal and taking the filtered signal phase as the negative eddy current correction factor;
wherein P is a positive integer greater than 1.

11. The device as claimed in claim 10, wherein said processor is configured to implement said filtering by:
acquiring the sampling interval of the positive/negative reference scan to acquire the mechanical vibration frequency of the magnet;
calculating the product of said positive/negative reference scanning sampling interval and said mechanical vibration frequency of the magnet, and then calculating the reciprocal of the product and taking the result as the length of the sliding window;
designing the mean sliding filter according to said length of the sliding window; and
performing mean sliding filtering of said positive/negative reference signal with said mean sliding filter.

12. The device as claimed in claim 11, wherein said control unit and said processor are configured to acquire the mechanical vibration frequency of the magnet comprises:
said control unit operating said MR spectroscopic data acquisition unit to obtain a spectrum measurement of the water modeling using a Point-Resolved Spectroscopy (PRESS) sequence, to obtain spectrum of the water modeling signal;
said processor calculating the absolute value of the frequency difference between the water peak and any nearest side band in said spectrum, and taking the absolute value as the mechanical vibration frequency of the magnet.

13. The device as claimed in claim 10, wherein said processor is configured to implement said filtering by:
calculating the positive/negative filtering bandwidth;
designing a Gaussian band-pass filter according to said positive/negative filtering bandwidth; and
band-pass filtering said positive/negative reference signal with said Gaussian band-pass filter.

14. The as claimed in claim 13, wherein said processor is configured to calculate the positive/negative filtering bandwidth by:
acquiring the spectrum of the positive/negative reference scan;
if there is no overlapping part between the water signal and the metabolite signal in the positive/negative reference scanning spectrum, acquiring the waveband of the water signal and using the acquired waveband as the positive/negative filtering bandwidth; and
if there is an overlapping part between the water signal and the metabolite signal in the positive/negative reference scanning spectrum, dividing the overlapping waveband between the water signal and the metabolite signal is by 2 to acquire a quotient, and then calculating the difference between the waveband of the water signal and said quotient, and using the result as the positive/negative filtering bandwidth.

15. The device as claimed in claim 9 wherein said processor is configured to:
   determine said eddy current correction of the positive gradient scanning signal by calculating the difference between the phase of said positive gradient scanning signal and said positive eddy current correction factor; and
   determine said eddy current correction of the negative gradient scanning signal by calculating the difference between the phase of said negative gradient scanning signal and said negative eddy current correction factor.

16. The device as claimed in claim 9 wherein said processor is configured to calculate the side-band suppressed spectrum signal by adding the N/2 positive gradient scanning signals that have undergone said eddy current correction and the N/2 negative gradient scanning signals that have undergone said eddy current correction, and then calculating an average value and using the result as the side-band suppressed spectrum signal.

* * * * *